United States Patent [19]
Strege

[11] Patent Number: 5,023,198
[45] Date of Patent: Jun. 11, 1991

[54] METHOD FOR FABRICATING SELF-STABILIZED SEMICONDUCTOR GRATINGS

[75] Inventor: Keith E. Strege, Branchburg Township, Somerset County, N.J.

[73] Assignee: AT&T Bell Laboratories, Murray Hill, N.J.

[21] Appl. No.: 486,577

[22] Filed: Feb. 28, 1990

[51] Int. Cl.⁵ ............................................ H01L 21/20
[52] U.S. Cl. ........................... 437/129; 148/DIG. 72; 148/DIG. 95; 148/DIG. 119; 148/33.4; 437/90; 437/133; 437/247; 437/972; 372/96
[58] Field of Search ................. 148/DIG. 3, 4, 15, 50, 148/51, 56, 65, 72, 95, 97, 106, 110, 119, 134, 169, 33-33.2, 33.4; 156/610-614; 357/16, 17; 372/43, 46, 48, 50, 96, 102; 437/81, 82, 89, 90, 105, 107, 108, 111, 126, 129, 133, 247, 947, 963, 972

[56] References Cited

U.S. PATENT DOCUMENTS 4,716,132  12/1987  Hirata ................................. 437/129
4,796,274   1/1989  Akiba et al. ........................ 372/96
4,843,032   6/1989  Tokuda et al. ..................... 437/129

FOREIGN PATENT DOCUMENTS 0046083  3/1984  Japan ................................. 372/96
0127891  7/1984  Japan ............................... 437/129
0065588  4/1985  Japan ................................. 372/96
0004386  1/1987  Japan ............................... 437/129
0296588 12/1987  Japan ................................. 372/96
0124279  5/1989  Japan ................................. 372/96

OTHER PUBLICATIONS

Goldstein et al., "Performance of a Channelled-Substrate-Planar...", Electron. Lett., vol. 23, No. 21, 8th Oct. 1987, pp. 1136-1137.
Logan et al., "Reproducible... InGaAsP Buried Heterostructure Lasers", Appl. Phys. Lett., 51(18), 2 Nov. 1987, pp. 1407-1409.
Sato et al., "Defect Generation Due to Surface Corrugation in InGaAsP/InP DFB Lasers...", J. Crys. Growth, 93 (1988), pp. 825-831.
Correc, "Coupling Coefficients for Partially Meltback Tropezoidal Gratings", IEEE J. Quantum Electron, vol. 24, No. 10, Oct. 1988, pp. 1963-1965.
Temkin, "High-Speed Distributed Feedback Lasers Grown by Hydride Epitaxy", Appl. Phys. Lett., 53(13), 26 Sep. 1988, pp. 1156-1158.
Cao, M. et al, "GaInAsP/InP Single-Quantum-Well (SQW) Laser with Wire-Like Active Region Towards Quantum Wire Laser", Electronics Letters, vol. 24, No. 13, Jun. 23, 1988, pp. 824-825.
Takemoto, A. et al, "1.3-μm Distributed Feedback Laser Diode With a Grating Accurately Controlled by a New Fabrication Technique," Optical Fiber Communication Conference, 1989 Technical Digest Series, vol. 5, 6-9 Feb., 1989, Houston, Tex., p. 54.
Miyamoto, Y. et al, "Light Emission from Quantum-Box Structure by Current Injection," Japanese Journal of Applied Physics, vol. 26, No. 4, Apr., 1987, pp. L225-L227.
Takemoto, A. et al, "1.3 μm Distributed Feedback Laser Diode with Grating Accurately Controlled by New Fabrication Technique," Electronics Letters, vol. 25, No. 3, 2 Feb. 1989, pp. 220-221.
Daste, P. et al, "Fabrication Technique for GaInAsP/InP Quantum Wire Structure by LP-MOVPE," Journal of Crystal Growth, vol. 93, pp. 365-369 (1988).

Primary Examiner—Olik Chaudhuri
Assistant Examiner—William Bunch
Attorney, Agent, or Firm—D. I. Caplan; W. G. Nilsen

[57] ABSTRACT

A quaternary semiconductor diffraction grating, such as an InGaAsP grating suitable for a DFB laser, is embedded in a semiconductor substrate, such as InP. In one embodiment, the grating is fabricated by
(1) forming on the top surface of an InP substrate body an epitaxial layer of InGaAsP coated with an epitaxial layer of InP;
(2) forming a pattern of apertures penetrating through the layers of InP and InGaAsP; and
(3) heating the body to a temperature sufficient to cause a mass transport of InP from the InP epitaxial layer, the thickness of the InP layer being sufficient to bury the entire surface of the InGaAsP layer with InP.

20 Claims, 3 Drawing Sheets

METHOD FOR FABRICATING SELF-STABILIZED SEMICONDUCTOR GRATINGS

TECHNICAL FIELD

This invention relates to semiconductor processing and more particularly to processing semiconductor gratings (corrugations).

BACKGROUND OF THE INVENTION

Semiconductor gratings are useful in such contexts as an optical filter and a distributed feedback (DFB) laser. In such a laser, for example, the optical feedback is supplied by a semiconductor grating layer which is fabricated as an epitaxial (crystal) layer in proximity to an epitaxial active layer (light-generating region) of the laser.

In a paper authored by A. Takemoto et al, entitled "1-3 μm Distributed Feedback Laser Diode with Grating Accurately Controlled by New Fabrication Technique," and printed in *Electronics Letters*, Vol. 25, No. 3, pp. 220–221 (2 Feb. 1989), an indium phosphide (InP) based laser was described in which a grating was formed by epitaxial growth of a continuous layer of indium gallium arsenide phosphide (InGaAsP) on a "barrier" (spacer) layer of InP. The barrier layer separated this InGaAsP layer from the active region of the laser. Then grooves were etched into the InGaAsP layer down to the barrier layer to form a corrugated InGaAsP layer. Next, an InP cladding layer was grown by metal organic chemical vapor deposition (MOCVD) over the corrugated InGaAsP layer, in order to preserve the corrugations. However, lasers made this way suffer from degradation of the corrugations—that is, roundings of the sharp corners of the crests of the InGaAsP layers and lattice defects in their crystal structure. Hence a deterioration of optical coupling between grating and active region, as well as poor laser device reliability, resulted.

In a paper authored by P. Daste et al, entitled "Fabrication Technique for GaInAsP/InP Quantum Wire Structure by LP-MOVPE," published in *Journal of Crystal Growth*, Vol. 93, pp. 365–369 (1988), there was disclosed the growth of a relatively thin (20 nm) InP topping layer on top of a (30 nm) InGaAsP active layer prior to etching the grooves, in order to protect the wire-like (corrugated) active layer during epitaxial regrowth of the InP cladding layer. The regrowth can be performed by MOCVD or other epitaxial growth method, such as hydride vapor phase epitaxy (VPE) or liquid phase epitaxy (LPE). Such epitaxial regrowth advantageously is performed at temperatures high enough to prevent proliferation of defects in the epitaxially regrown InP cladding layers, typically temperatures in the approximate range of 600° C. to 650° C. or more. At these temperatures, I have found that the topping layer taught by P. Daste et al does not prevent defects in the regrown InP cladding layer. These defects are undesirable because during laser operation they tend to propagate into the active layer and degrade laser lifetime.

Therefore it would be desirable to have a method for fabricating corrugated quaternary InGaAsP layers, for example, which are stable at the relatively high temperatures (above approximately 600° to 650° C.) required for the subsequent epitaxial growth of the desired high quality (crystal defect free) binary InP cladding layers.

SUMMARY OF THE INVENTION

This invention provides a method for fabricating self-stabilized corrugated semiconductor layers (semiconductor gratings)—i.e., which are stable at the relatively high temperatures required for the subsequent growth of epitaxial layer(s) for the remaining structure, such as a binary semiconductor cladding layer for a DFB laser. The invention is based upon my discovery that the relatively thin topping layer used in prior art is not sufficiently thick to prevent degradation of the corrugations. This degradation of the corrugations is probably caused by a subsequent mass transport of InGaAsP—and hence change in its chemical composition from place to place—at the relatively high temperatures (above approximately 600° to 650° C.) required for the subsequent epitaxial growth of InP cladding over the grating.

In accordance with the invention, a desirably self-stabilized grating is achieved by epitaxially growing in succession two chemically different semiconductor layers located on a semiconductor buffer layer, followed by forming grooves (apertures) penetrating through the top layer and at least a portion of the depth of the bottom layer and preferably all the way through the bottom layer, even to the extent whereby trenches are formed in the buffer layer (located underneath the bottom layer). The layers are then heated to a sufficiently high temperature prior to further crystal growth of the remaining structure, whereby material of the top layer mass transports and buries the entire surface of the bottom layer everywhere with the material of the top layer and thereby stabilizes the bottom layer during further epitaxial growth of the remaining structure. By the term "substantially buries" it is meant that the bottom of the top layer substantially everywhere is located above the top of the bottom layer, and at those points where the bottom of the top layer goes below the top of the bottom layer it does not do so by more than about 30% of the thickness of the bottom layer. In order to achieve this "buried" result, the volume of material situated in the top layer after the grooves have been formed, but before the heating, should be greater than the volume of the grooves in the bottom layer (plus grooves in the buffer layer, if any). With a (desirable) duty cycle of corrugations equal to about one-half—i.e., half the volume of the grating layer being occupied by grooves—the thickness of the top layer should be greater than the thickness of the bottom layer.

In a specific embodiment, a DFB grating for a laser structure is fabricated on an InP substrate. On a major surface of the substrate there are grown two thin epitaxial layers, a quaternary InGaAsP layer followed by a burial layer of InP. Grooves for the grating are etched, each of the grooves penetrating through both of the layers. Each of the resulting grating strips is thus composed of a strip of InGaAsP capped by a strip of InP. This structure is heated prior to further crystal growth, whereby the InP from the burial layer of InP mass-transports before the quaternary InGaAsP has an opportunity to do so, and thus InP buries the quaternary strip beneath it. More InP is then deposited on the burial layer. During subsequent epitaxial processing, the InP layer thus preserves the InGaAsP grating before the latter can degrade: The InP locks in (buries) the quaternary InGaAsP prior to epitaxial growth of the rest of the laser structure.

BRIEF DESCRIPTION OF THE DRAWINGS(S)

This invention—together with its features, advantages, and characteristics—may be better understood from the following detailed description when read in accordance with the drawing in which FIGS. 1 through 4 depict cross-sectional views of a semiconductor laser being fabricated with a grating in accordance with one embodiment of the invention; and FIGS. 5 and 6 depict cross-sectional views of a semiconductor laser being fabricated with a grating in accordance with another embodiment of the invention.

DETAILED DESCRIPTION

Figure 1:
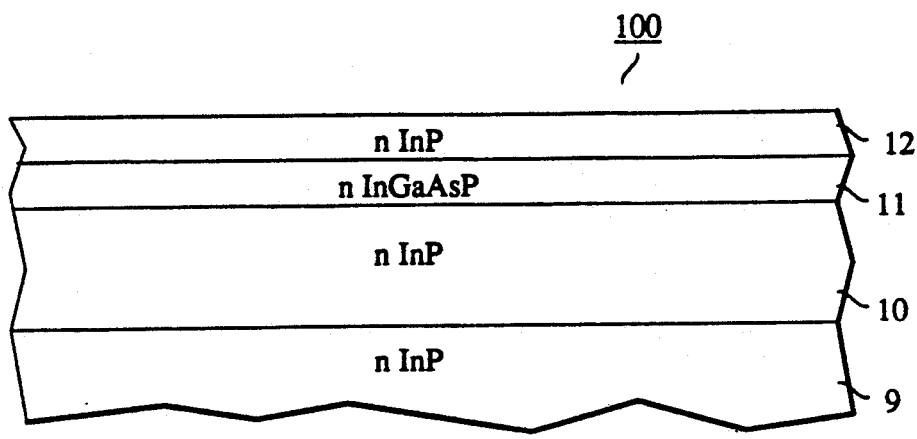

As shown in FIG. 1, upon a top surface of an n-type InP monocrystalline semiconductor body (substrate) 9 there are epitaxially grown—for example, in an epitaxial reactor—an InP n-type buffer layer 10, a lattice-matched n-type InGaAsP layer 11 and an n-type InP layer 12, to form the structure 100. The thickness of the InP layer 12 is typically about 70 nm, while that of the InGaAsP layer 11 is about 50 nm. Typically, the lattice matched InGaAsP has an energy bandgap corresponding to a vacuum wavelength of between about 1.1 to 1.3 $\mu$m.

Then, outside the epitaxial reactor, by selective resist masking and etching—such as by holographic photoresist masking followed by wet etching or reactive ion etching—a diffracting pattern of grooves 20 (FIG. 2) is formed in the top surface, to form the structure 200. Typically, these grooves (apertures) 20 all run perpendicular to the plane of the drawing. The grooves 20 typically penetrate all the way through the layer 12, to form a (discontinuous) InP layer 22 and through the InGaAsP layer 11, to form a discontinuous InGaAsP layer 21. Alternatively (not shown), the grooves 20 penetrate all the way through the layer 11, whereby trenches (not shown) are formed in the buffer layer 10. Preferably, the masking for etching the grooves is arranged so that about a half of the top surface of the buffer layer 10 is coated with the layer 21—i.e., to produce a duty cycle of the grating equal to about a half. Advantageously, in such a case the thickness of the binary InP layer 12 is greater than the thickness of the quaternary layer 11.

Figure 2:
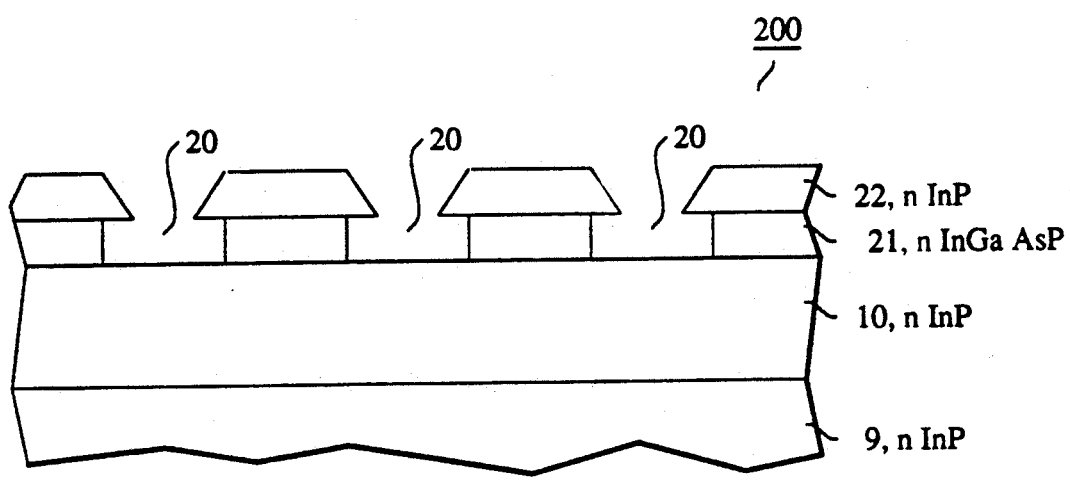

As shown in FIG. 2, undercutting into the layer 21 can occur, depending upon the etching technique used, as known in the art. In any event, the volume of InP remaining in the layer 22 (just after etching) is greater than the volume of the grooves in the InGaAsP layer 21 (including undercuts therein, if any, plus trenches in the buffer layer 10, if any).

Figure 3:
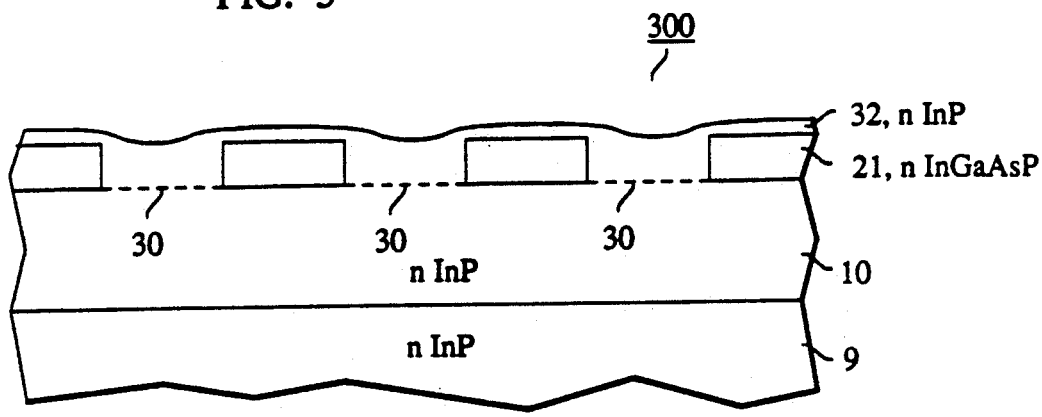

Next, the mask is removed, and the structure 200 is then heated to form the structure 300 shown in FIG. 3. That is, the structure 200 is heated, inside the epitaxial reactor, to a sufficient temperature for a sufficient time—typically about in the approximate range of 650° to 700° C. for about 5 minutes in an atmosphere of $H_2$ and phosphine ($PH_3$, $5 \times 10^{-4}$ mole fraction)—whereby a mass transport of InP (from the InP layer 22) covers all previously exposed portions of the InGaAsP layer 21. Note that as a result of the heating, the top surface of the InP layer 32 becomes smoother, while the InP of the layer 22 buries the layer 21. The dotted line 30 indicates a coming into contact of the InP of the layers 32 and 10.

For the purpose of further epitaxial growth to form the laser, the surface of the InP layer 32 is advantageously made more nearly planar. To this end, more n-type InP is epitaxially grown on the top surface of the InP layer 32, to form a more nearly uniformly thick InP layer 42 for further epitaxial growth thereon. Next, there is epitaxially grown upon the top surface of this InP layer 42 an undoped InGaAsP layer 43. Then there are epitaxially grown in succession a p-type InP layer 44 and a p-type InGaAsP layer 45. To complete the laser, using silicon dioxide stripes as a mask, mesas (not shown) can be etched which are filled with current-blocking layers of p- and n- semi-insulating InP. The entire structure then can be buried as known in the art with a relatively thick epitaxial p-type InP and a relatively thin epitaxial contact layer of p+ InGaAs (not shown). Finally, the laser is finished by forming electrodes (not shown) on the top and the bottom surfaces of the structure 400, as well as forming isolation between, or physically separating, neighboring laser structures being built on a single substrate, as known in the art.

The layers 21, 42, 43, 44 and 45 respectively, can serve as grating, spacer, active, cladding, and capping layers for the laser structure 400. All the above-mentioned epitaxial growth steps can be performed, for example, by MOCVD, VPE, or LPE.

In a typical embodiment: the spacer layer 42 has a thickness of about 0.1 $\mu$m and a doping level of about 1E18 per cubic centimeter; the active layer 43 has a thickness of about 0.1 $\mu$m and a carrier concentration of about 1E16 per cubic centimeter; the cladding layer 44 has a thickness of about 0.6 $\mu$m and a doping level of about 2E18 per cubic centimeter; and the capping layer 45 has a thickness of about 0.2 $\mu$m and a doping level of about 1E19 per cubic centimeter.

Figure 4:
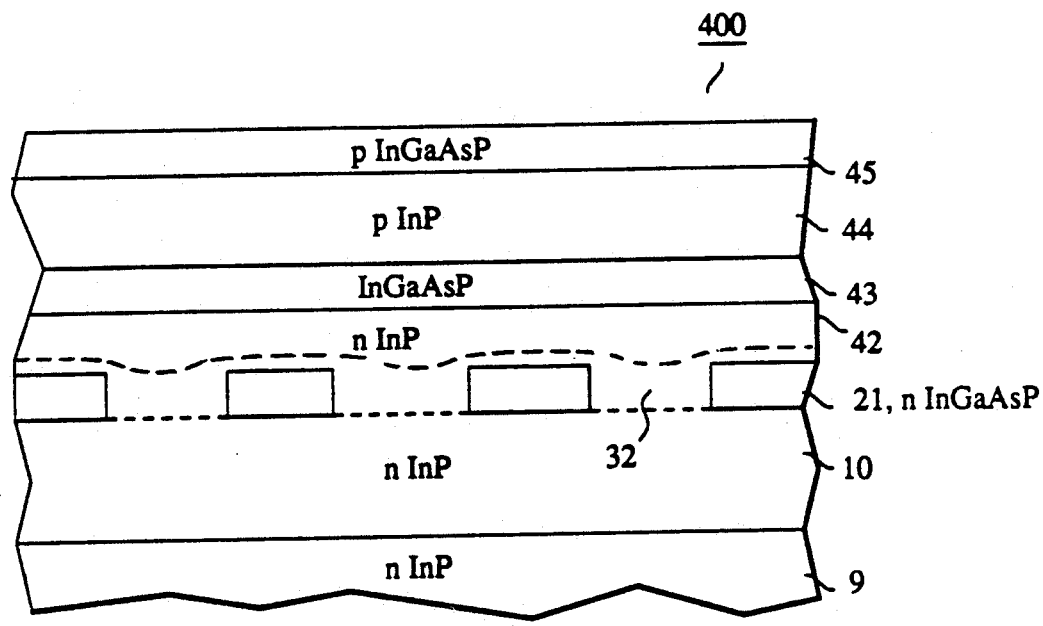
Figure 5:
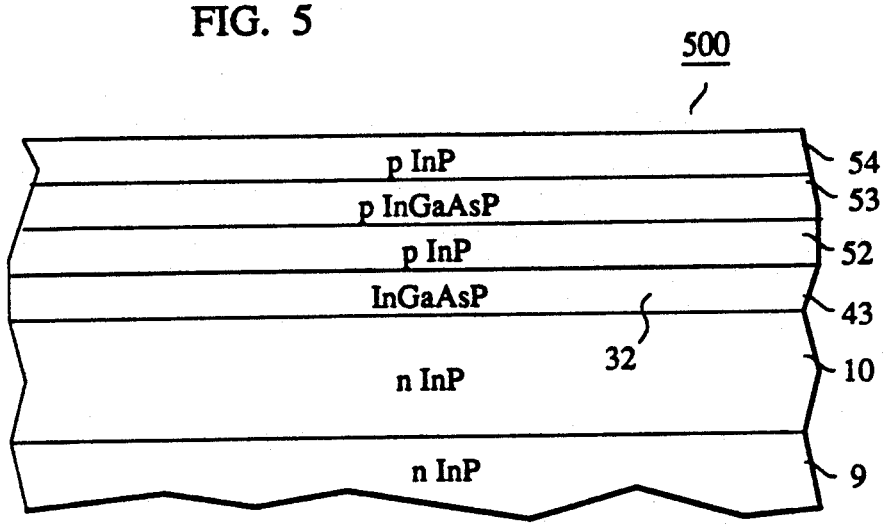

In accordance with another embodiment (FIGS. 5 and 6), the grating is fabricated above, rather than beneath, the active layer. In this way, the slight indeterminacy and/or nonuniformity in the thickness of the InP layer 42 (FIG. 4) can be avoided, if desired. As shown in FIG. 5, in order to fabricate such a grating, a structure 500 is prepared including an n-type substrate 9, an n-type buffer layer 10, an n-type InGaAsP active layer 43, a 100 to 200 nm thick p-type InP spacer layer 52, a 30 to 100 nm thick p-type InGaAsP grating precursor layer 53, and a 60 to 120 nm thick p-type InP burial layer 54. Elements in FIGS. 5 and 6 that are the same as, or similar to, those in FIGS. 1-4 have been given the same reference numerals. All dimensions are approximate. In any event, however, the InP burial layer 54 is advantageously thicker than the grating precursor layer 53.

Figure 6:
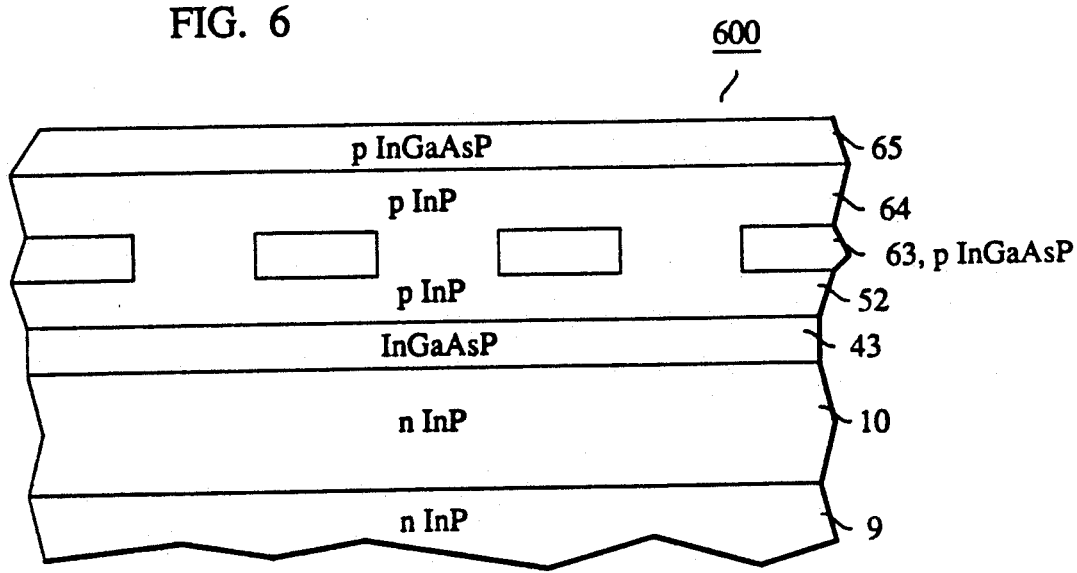

By selective masking and etching, grooves are etched through the burial layer 54 and the grating precursor layer 53 down to the spacer layer 52, to form an InGaAsP grating layer 63 (FIG. 6). The mask is removed, and the structure is heated to a temperature in the approximate range of about 650° to 700° C., whereby the InP burial layer 54 buries the InGaAsP grating layer 63 with InP.

Next (FIG. 6), more p-type InP is grown on the surface of the remains of InP burial layer, to form an InP cladding layer 64, typically about 0.8 $\mu$m thick. Then a p-type InGaAsP capping layer 65 having a thickness of typically about 0.12 $\mu$m is formed on the top surface of the cladding layer 64, to form the (preliminary) laser structure 600. To complete the laser, using silicon dioxide stripes as a mask, mesas (not shown) can be etched which are filled with current-blocking layers of p- and n- semi-insulating InP. Finally, the entire structure can be buried as known in the art with a relatively thick epitaxial p-type InP and a relatively thin epitaxial contact layer of p+ InGaAs (not shown). Electrode stripes (not shown) running parallel to the stripes of the grating 63 can then be deposited on top and bottom surfaces of the resulting laser structure, as known in the art.

Although the invention has been described in detail with reference to specific embodiments, various modifications can be made without departing from the scope of the invention. For example, upon an InP buffer or substrate layer are successively grown an InGaAsP ($\lambda = 1.3$ μm) active layer, an InGaAsP ($\lambda = 1.1$ μm) grating (precursor) layer, and an InP burial layer—apertures then being formed through the InP burial layer and the InGaAsP grating layer, followed by the structure's being heated to bury the InGaAsP grating layer with InP by mass transport—whereby the grating layer is in contact with the active layer.

I claim:

1. A method of fabricating a semiconductor grating comprising the steps of:
   (a) growing upon a top major surface of a first layer of first semiconductor material a second layer of second semiconductor material;
   (b) growing upon the second layer of second semiconductor material a third layer of third semiconductor material;
   (c) forming a plurality of grooves each of which penetrates through the third layer and through at least a portion of the depth of the second layer; the thickness of the third layer being sufficient so that, after the grooves have been formed, the volume of third material in the third layer is greater than the volume of the grooves in the second layer plus the volume of any grooves in the first layer; and
   (d) heating the first, second, and third layers to a temperature sufficient to cause a mass transport of the third material of the third layer, whereby the entire surface of the grooves in the second layer and any surface of any grooves in the first layer is substantially buried by the third material.

2. the method of claim 1 in which each of the grooves penetrates through the entire depth of the second layer.

3. the method of claim 2 in which the second material is essentially indium gallium arsenide phosphide.

4. The method of claim 3 in which the third material is essentially indium phosphide.

5. The method claim 4 in which the first materis is essentially indium phosphide.

6. The method of claim 2 in which the third material is essentially indium phosphide.

7. The method of claim 6 in which the first material is essentially indium phosphide.

8. The method of claim 1 in which the second material is essentially indium gallium arsenide phosphide.

9. The method of claim 8 in which the third material is essentially indium phosphide.

10. the method of claim 9 in which the first material is essentially indium phosphide.

11. The method of claim 10 in which the third material is essentially

12. The method of claim 11 in which the first material is essentially indium phosphide.

13. In a method for fabricating a semiconductor laser: the steps recited in claim 1.

14. A method for fabricating a semiconductor laser comprising the steps recited in claim 1.

15. The method of claim 14 in which the third material is InP.

16. A method for fabricating a semiconductor laser comprising the steps recited in claim 1 followed by growing another layer of third material on the surface of the third layer.

17. The method of claim 16 in which the third material is InP.

18. The method of claim 17 in which the first material is InP.

19. A method of fabricating a semiconductor grating comprising the steps of
   (a) growing upon a top major surface of a first layer of first semiconductor material a second layer of second semiconductor material;
   (b) growing upon the second layer of second semiconductor material a third layer of third semiconductor material having a thickness greater than the thickness of the second layer;
   (c) forming a plurality of grooves each of which penetrates through the third layer and through at least a portion of the depth of the second layer; the thickness of the third layer being sufficient so that, after the grooves have been formed, the volume of third material in the third layer is greater than the volume of the grooves in the second layer; and
   (d) hating the first, second, and third layers to a temperature sufficient to cause a mass transport of the third material of the third layer, whereby the substantially entire surface of the second layer is buried with the third material.

20. The method of claim 19 in which the third material is essentially InP.

* * * * *

UNITED STATES PATENT AND TRADEMARK OFFICE
CERTIFICATE OF CORRECTION

PATENT NO. : 5,023,198

DATED : 6/11/91

INVENTOR(S) : Keith E. Strege

It is certified that error appears in the above-identified patent and that said Letters Patent is hereby corrected as shown below:

Column 5, line 45, "the" should be --The--.
Column 5, line 47, "the" should be --The--.
Column 5, line 51, "materis" should be --material--.
Column 6, line 45, "hating" should be --heating--.

Signed and Sealed this

Sixteenth Day of February, 1993

Attest:

STEPHEN G. KUNIN

Attesting Officer        Acting Commissioner of Patents and Trademarks